(12) United States Patent
Kim et al.

(10) Patent No.: US 6,287,981 B1
(45) Date of Patent: Sep. 11, 2001

(54) ELECTRODE FOR GENERATING A PLASMA AND A PLASMA PROCESSING APPARATUS USING THE SAME

(75) Inventors: Tae-Hoon Kim; Kwon Son, both of Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/389,027

(22) Filed: Sep. 2, 1999

(30) Foreign Application Priority Data

Sep. 3, 1998 (KR) .................................................. 98-36275

(51) Int. Cl.$^7$ .................................................. H01L 21/00
(52) U.S. Cl. ........................... 438/729; 156/345; 216/71; 438/710
(58) Field of Search ...................... 216/67–71; 156/345, 156/345 P; 438/710, 729, 730

(56) References Cited

U.S. PATENT DOCUMENTS

| 4,578,559 | * | 3/1986 | Hijikata et al. | 216/71 X |
| 5,298,720 | * | 3/1994 | Cuomo et al. | 156/345 X |
| 5,399,254 | * | 3/1995 | Geisler et al. | 156/345 X |
| 6,010,636 | * | 1/2000 | Donohue et al. | 438/729 X |

* cited by examiner

Primary Examiner—William A. Powell
(74) Attorney, Agent, or Firm—The Law Offices of Eugene M. Lee, PLLC

(57) ABSTRACT

A plasma processing apparatus includes a plasma generating electrode containing at least one protrusion for improving the plasma density and uniformity. The apparatus may be a plasma dry etching apparatus, a plasma enhanced CVD deposition apparatus or a sputtering apparatus.

18 Claims, 4 Drawing Sheets

ELECTRODE FOR GENERATING A PLASMA AND A PLASMA PROCESSING APPARATUS USING THE SAME

BACKGROUND OF THE INVENTION

1. Field of the Invention

The invention relates generally to an electrode for plasma generation and more particularly, to a plasma processing apparatus.

2. Description of the Related Art

The capacity and functions of semiconductor devices has recently increased with improvements in semiconductor device integration. More semiconductor devices have been formed on a limited size wafer, and the pattern sizes for semiconductor devices have been decreasing in size.

To achieve the improved device integration, ionized process gas (i.e., plasma) has been utilized in semiconductor device fabrication. Specifically, plasma dry etching is used to pattern semiconductor devices. The etching gas in the plasma state contains ions, electrons and radicals.

The plasma dry etching apparatuses for manufacturing semiconductor devices can be divided according to the construction of electrodes to form the plasma and the usage of a magnetic field. For example, the etching apparatus may be a RIE (Reactive Ion Etching) apparatus, a MERIE (Magnetically Enhanced Reactive Ion Etching) apparatus, a CDE (Chemical Downstream Etching) apparatus, an ECR (Electron Cyclotron Resonance) apparatus, a TCP (Transformer Coupled Plasma) apparatus, etc.

FIG. 1 schematically shows a conventional plasma dry etching apparatus. Referring to FIG. 1, the apparatus contains a process chamber 10 for performing dry etching by plasma which is generated by ionizing a supplied process gas.

The process chamber 10 contains a gas supply line 12 to supply a process gas into the process chamber 10. A vacuum line 14 to form a vacuum inside the process chamber 10 is provided on the lower side of the process chamber 10. A vacuum pump 18 is connected to the vacuum line 14 to perform pumping. A valve 16 is provided on the vacuum line 14 to control the pressure inside the process chamber 10.

In addition, a lower electrode 20 is provided inside the lower portion of the process chamber 10. A wafer 22 to be etched is mounted on the lower electrode 20. An upper electrode 24 is provided in the upper portion of the process chamber 10. High frequency power is applied to the lower electrode 20 from a high frequency power source 28. The power is supplied to the lower electrode 20 through a matching box 26. The high frequency power source 28 and the upper electrode 24 are both grounded.

The etching apparatus operates as follows. First, the valve 16 installed on the vacuum line 14 is opened and the inside of the process chamber 10 is evacuated to a high vacuum state by the operation of the vacuum pump 18. Then, a process gas such as $CF_4$, $HBr$, $Cl_2$, $Ar$, etc. is supplied into the process chamber 10 through the gas supply line 12.

Then, when the high frequency power source 28 applies a certain high frequency power to the lower electrode 20, an electric field is formed inside the process chamber 10 between the lower electrode 20 and the upper electrode 24. The lower electrode 20 emits electrons which are accelerated with kinetic energy by the electric field into the process gas. The electrons passing through the process gas impart energy to the process gas by colliding with the process gas atoms or molecules. The energized process gas is ionized so as to form ions. The ions are then accelerated by the electric field. The ions pass through the process gas and collide with and ionize further process gas atoms or molecules to generate a plasma state having positive ions, negative ions and radicals.

The positive ions and the radicals from the plasma impinge on the surface of the wafer 22 and etch a certain portion of the wafer. Hence, the wafer 22 is patterned by dry plasma etching. However, the conventional plasma etching process suffers from the problem of non uniform etching over the whole area of the wafer 22. As shown in FIG. 2, the plasma density is constant in a certain region around the center of the process chamber 10. However, the plasma density decreases toward the edges or peripheral portion of the process chamber. Therefore, the plasma density is non uniform throughout the process chamber.

The non uniform plasma density adversely effects the etching uniformity of the wafer. For a large diameter wafer, such as an 8 inch or a 9 inch wafer, the etch rate at the edge of the wafer is lower than the etch rate at the c (enter of the wafer, which results in an etch failure around the edge of the wafer (i.e., the peripheral areas of the wafer are insufficiently etched which results in formation of defective devices at the periphery of the wafer).

In addition, the value of the plasma density formed inside the process chamber is related to the values of high frequency power and the surface area of the electrode. However, the surface area of the electrode is limited by the placement of other parts inside the process chamber. Therefore, there is a limit on how large the electrode may be made to increase the plasma density. The present invention is directed to overcoming or at least reducing the effects of one or more of the problems set forth above.

SUMMARY OF THE INVENTION

In accordance with one aspect of the invention there is provided an electrode for generating a plasma comprising at least one protrusion on a first side of the electrode.

In accordance with another aspect of the invention there is provided a plasma processing apparatus, comprising a process chamber, a first electrode inside the process chamber, a second electrode comprising at least one protrusion opposite to the first electrode, a gas supply line and a high frequency power source electrically connected to at least one of the first electrode and the second electrode.

In accordance with another aspect of the invention there is provided a method of processing a substrate, comprising placing a substrate over a lower electrode, generating a plasma between the lower electrode and an upper electrode containing at least one protrusion, contacting a surface of the substrate with positive ions generated in the plasma and etching a portion of the substrate or depositing a film on the substrate.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean application no. 98-36275, filed Sep. 3, 1998, discloses the same subject matter as the present application and is hereby incorporated by reference as if fully set forth herein.

The specific embodiments of the present invention provide an electrode for generating a plasma and a plasma processing apparatus for etching or depositing of thin films or layers during manufacture of semiconductor or other solid state devices. The electrode for generating a plasma contains at least one protrusion which improves plasma uniformity inside a process chamber of the plasma processing apparatus. The apparatus allows for improved etch or deposition uniformity due to the improved plasma uniformity.

Figure 3:
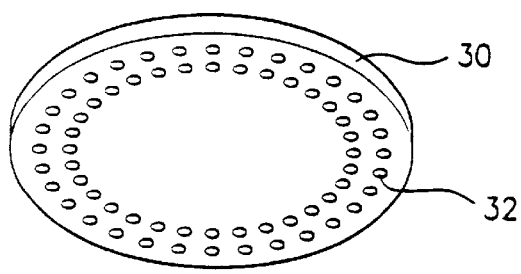
FIG. 3 is a perspective view of an upper electrode for generating a plasma according to one embodiment of the present invention.

FIG. 3 shows a perspective view of an upper electrode for generating a plasma according to one embodiment of the present invention. The upper electrode 30 contains a plurality of protrusions 32, formed around an edge or a peripheral portion to increase the surface area of a bottom surface of the electrode 32. Each protrusion 32 may be shaped as a circular cone, a three sided pyramid, a four sided pyramid, a five sided pyramid having one protruding point, a hemisphere, a polyhedron or any other desired shape which increases the electrode surface area.

It should be noted that while the upper electrode 30 is illustrated as having a plate shape in FIG. 3, it may comprise any other suitable shape, such as a dome or a cylinder. Preferably, the electrode 30 comprises a wall of a process chamber of a plasma processing apparatus.

Figure 1:
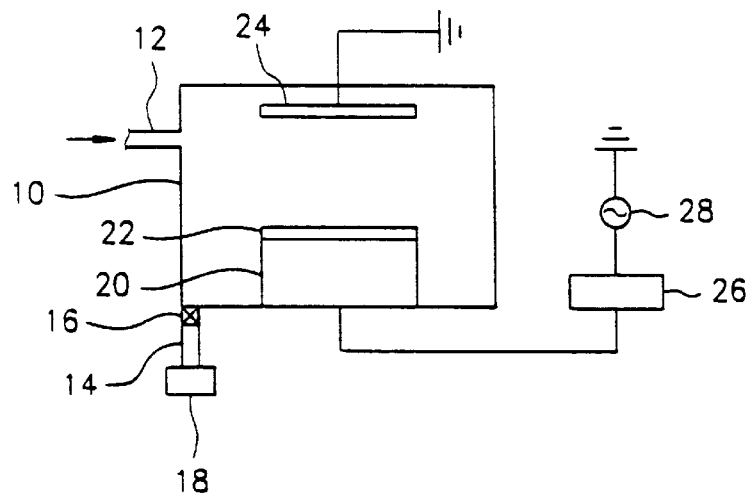
FIG. 1 is a cross-sectional view of a conventional plasma etching apparatus.
Figure 2:
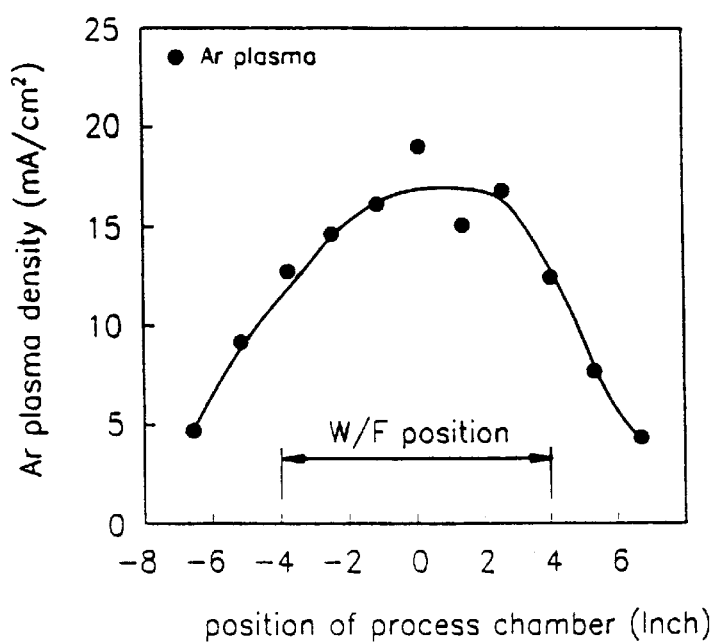
FIG. 2 is a graph of plasma density at different positions in the process chamber of the conventional plasma etching apparatus.

Plasma density is proportional to the electrode surface area. The electrode 30 has a higher surface area at its peripheral portion than at its inner or central portion due to the presence of the protrusions 32 at the peripheral portion but not at the inner portion. The increase in the surface area of the peripheral portion of the electrode increases the plasma density at the peripheral portion of the electrode. The increase in the plasma density due to the protrusions offsets the decrease in the plasma density around the periphery of the process chamber illustrated in FIG. 2. Therefore, the protrusions 32 at the peripheral portion of the electrode 30 result in an improved plasma uniformity across the entire electrode 30 and across the entire process chamber.

During an etching process, the magnitude of the electric field at the peripheral portion of the upper electrode 30 of the present invention is higher than at the peripheral portion of a prior art electrode 24. Therefore, the peripheral portion of a lower electrode which is coupled to a high frequency power source emits more free electrons than the inner portion of the lower electrode, because the peripheral portion of the lower electrode is located opposite of protrusions 32 at the peripheral portion of the upper electrode 30. This results in a more uniform ion density of the plasma across the process chamber, which allows a decrease in the number of or even an elimination of etch failures which occur at the edge of the wafer in the prior art etching apparatus.

Figure 4:
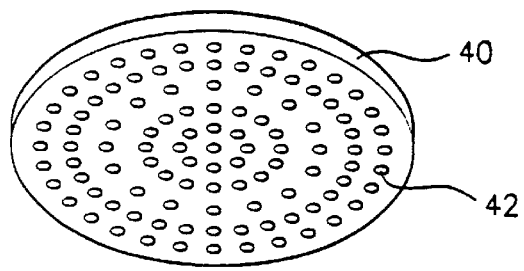
FIG. 4 is a perspective view of an a upper electrode for generating a plasma according to another embodiment of the present invention.

FIG. 4 shows a perspective view of an a upper electrode for generating a plasma according to another embodiment of the present invention. As shown in FIG. 4, a plurality of protrusions 42 are uniformly spaced over the entire bottom side or surface of the upper electrode 40. Therefore, the intensity of electric field is uniformly increased across the electrode 40, and the amount of free electrons emitted from the whole lower electrode coupled to a high frequency power source also increases. The increased number of emitted electrons increases the number of ions impinging on the substrate, thereby increasing the etch rate of the substrate.

In another embodiment of the present invention, the density of protrusions 32, 42 may be varied across the electrode 30, 40. For example, the density of protrusions may be higher in a first portion of the electrode than in a second portion. The protrusion density may be varied depending on the dimensions and layout of the process chamber to obtain an optimum plasma density and uniformity.

Preferably, the density of protrusions decreases from the edge or peripheral portion of the upper electrode 30, 40 to the center or inner portion so that the protrusions 32, 42 have a different radial density. This embodiment improves the plasma uniformity because the peripheral region of the upper electrode has a higher surface area than the inner portion, which offsets the decrease in peripheral plasma density shown in FIG. 2, while increasing the total plasma density across the entire process chamber because the surface area of the entire up per electrode is increased. Therefore, the intensity of electric field can be controlled, and the amount of the free electrons emitted from different regions can be optimized. Thus, the overall etch or deposition rate is increased without sacrificing etch or deposition rate uniformity.

Figure 5:
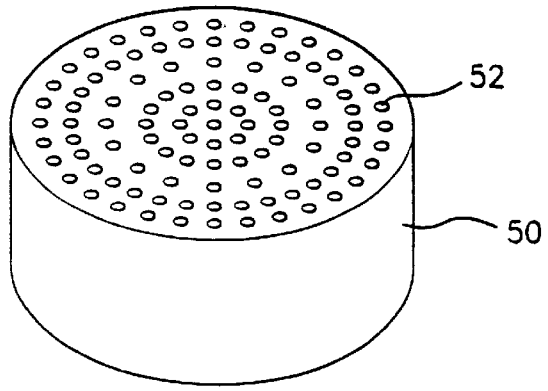
FIG. 5 is a perspective view of a lower electrode for generating a plasma according to another embodiment of the present invention.

In yet another embodiment of the present invention, as shown in FIG. 5, a plurality of protrusions 52 are also formed on the surface of the lower electrode 50, which is coupled to a high frequency power source. Preferably, the protrusions 52 are uniformly formed over the entire surface of the lower electrode 50 to increase the intensity of the electric field and the amount of free electrons emitted from the lower electrode 50. The increase in the number of emitted electrons increases the overall etch or deposition rate.

The protrusions 32, 42 and 52 may be formed on the upper electrode 30, 40, the lower electrode 50, or on both the upper and lower electrodes. Furthermore, the upper and lower electrodes may be reversed, and the high frequency power source may be coupled (i.e., electrically connected) to the upper electrode 30, 40. Alternatively, a high frequency power source may be coupled to each of the upper and lower electrodes.

Figure 6:
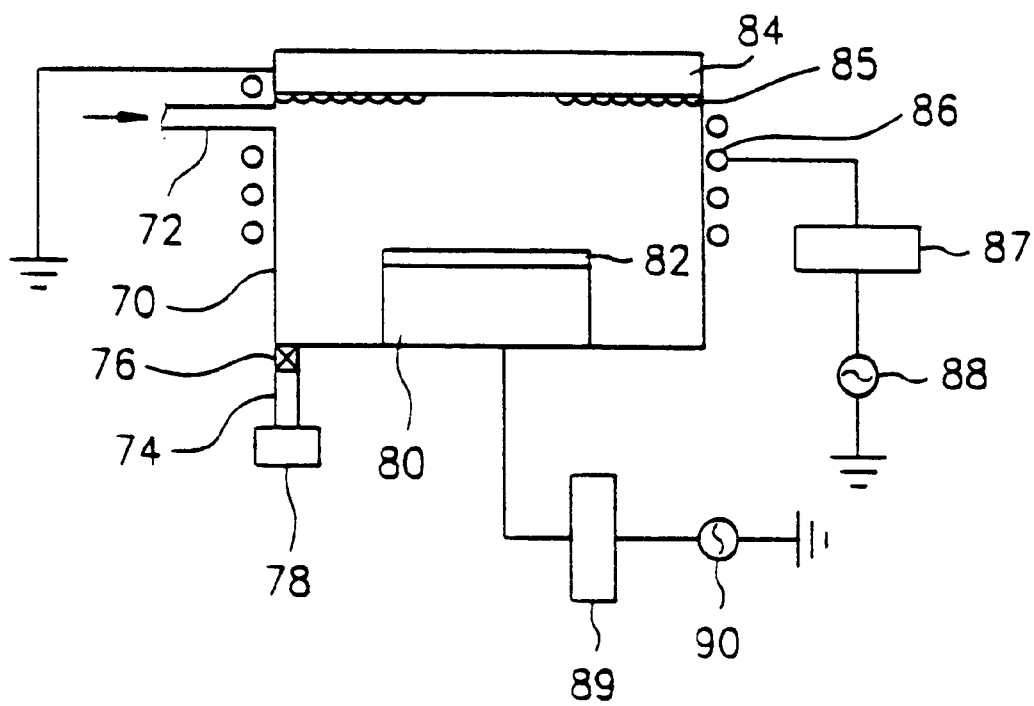
FIG. 6 is a cross-sectional view of a plasma processing apparatus according to one embodiment of the present invention.

FIG. 6 is shows one embodiment of a plasma processing apparatus for semiconductor or solid state device fabrication according to the present invention. Referring to FIG. 6, the apparatus comprises a process chamber 70 for dry plasma etching of a wafer or substrate. The plasma is generated by supplying a process gas and ionizing the process gas by applying a high frequency power, such as rf power, to an electrode in the process chamber 70.

The process chamber 70 contains a gas supply line 72 to supply the process gas into the process chamber 70. On the other side of the process chamber 70, a vacuum pump 78 is connected by a vacuum line 74 to the process chamber 70. A valve 76 is provided on the vacuum line 74 to regulate the pressure inside the process chamber 70.

The process chamber 70 also contains a lower electrode 80 on which a wafer 82 is mounted. A plate shaped upper electrode 84 is located above the lower electrode 80. The upper electrode 84 preferably comprises an upper portion of the process chamber 70. However, the upper electrode 84 may comprise a separate part below the top wall of the process chamber 70. A plurality of protrusions 85 are provided on the edge or peripheral portion of the upper electrode 84 to increase the surface area of the peripheral portion, and to increase the amount of the free electrons emitted from the edge or peripheral portion of the lower electrode 80. Each protrusion 85 may be shaped as a circular cone, a three sided pyramid, a four sided pyramid, a five sided pyramid having one protruding point, a hemisphere, a polyhedron or any other desired shape which increases the electrode surface area.

In addition, a magnetic field generating coil 86 may be wound on the outside of the process chamber 70 to improve the uniformity of the plasma. The coil 86 is electrically connected to a high frequency power source 88 through a matching box 87.

The lower electrode 80 is electrically connected to a high frequency power source 90 (such as an rf power source) through a matching box 89. The upper electrode 84 and the high frequency power sources 88, 90 are grounded.

The operation of the apparatus will now be described. First, the valve 76 is opened and the vacuum pump 78 is turned on to evacuate the process chamber 70 to a high vacuum state. Then, a certain amount of process gas is supplied into the process chamber 70 through the gas supply line 72. Then, the high frequency power of 13.56 MHz generated at the high frequency power sources 88, 90 passes through the matching boxes 87, 89, respectively, to the coil 86 and the lower electrode 80. Therefore, a magnetic field is formed inside the coil 86, and an electric field is formed inside the process chamber 70.

The electric field causes free electrons to be emitted from the lower electrode 80. Since a plurality of protrusion 85 increase the surface area of the peripheral portion of the upper electrode 84, the edge or peripheral portion of the lower electrode 80 emits more free electrons compared to the center or inner portion of the lower electrode 80. The free electrons emitted from the lower electrode 80 transmit energy to the process gas, and the energized process gas is turned into a plasma containing ions, electrons and radicals. Here, the greater number of free electrons emitted from the peripheral portion of the lower electrode 80 compared to from the inner portion of the lower electrode 80 offsets the non uniform plasma density at the periphery of the processing chamber (see FIG. 2), which reulsts in an improvement in the uniformity of the plasma density inside the process chamber 70. The ions and radicals of the uniform plasma collide with the wafer or substrate 82 on the lower electrode 80 resulting in an improvement of the uniformity of the etch rate of the wafer or substrate 82.

Figure 7:
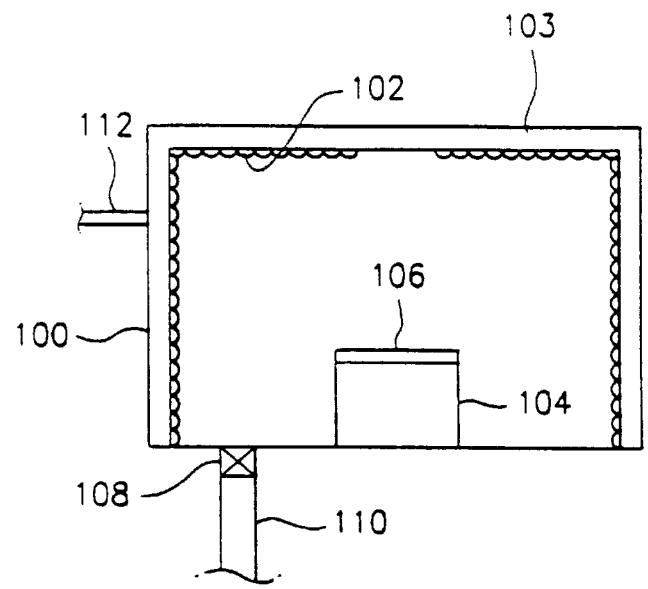
FIG. 7 is a cross-sectional view of a plasma processing apparatus according to another embodiment of the present invention.

FIG. 7 is a schematic view showing a second embodiment of the plasma processing apparatus according to the present invention. Referring to FIG. 7, the process chamber 100 has a cylinder shape. The process chamber 100 is preferably utilized for plasma dry etching. A gas supply line 112 is provided on one side of the process chamber 100 to supply process gas into the process chamber 100. On another side of the process chamber 100, a vacuum line 110 is connected to a vacuum pump (not shown). A valve 108 is provided on the vacuum line 110 to control the pumping force of the vacuum pump.

In addition, a lower electrode 104 on which a wafer 106 is mounted is provided on the lower side of the process chamber 100. A cylinder shaped upper electrode 103 is provided on the upper side of the process chamber 100 over the lower electrode 104. The upper electrode 103 preferably comprises the upper and side walls of the process chamber 100. A plurality of protrusions 102 are provided on the edge or peripheral portion of the upper electrode 103 to increase the amount of the free electrons emitted from the edge or peripheral portion of the lower electrode 104. Each protrusion 102 may be shaped as a circular cone, a three sided pyramid, a four sided pyramid, a five sided pyramid having one protruding point, a hemisphere, a polyhedron or any other desired shape which increases the electrode surface area. The apparatus according to the embodiment shown in FIG. 7 operates in the same manner as the apparatus of the previous embodiment.

Figure 8:
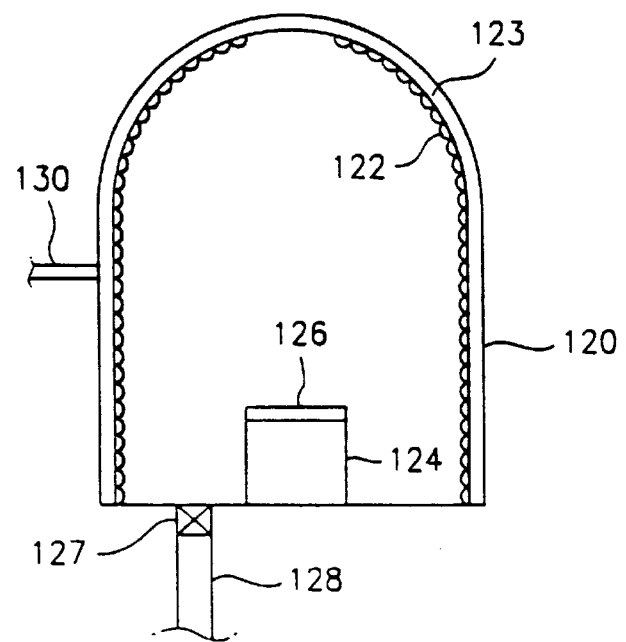
FIG. 8 is a cross-sectional view of a plasma processing apparatus according to another embodiment of the present invention.

FIG. 8 is a schematic view showing a third embodiment of the plasma processing apparatus according to the present invention. Referring to FIG. 8, the process chamber 120 has a dome shape. The process chamber 120 is preferably utilized for plasma dry etching. A gas supply line 130 is provided on one side of the process chamber 120 to supply process gas into the process chamber 120. On another side of the process chamber 120, a vacuum line 128 is connected to a vacuum pump (not shown). A valve 126 is provided on the vacuum line 128 to control the pumping force of the vacuum pump.

In addition, a lower electrode 124 on which a wafer 126 is mounted is provided on the lower side of the process chamber 120. A dome shaped upper electrode 123 is provided on the upper side of the process chamber 120 over the lower electrode 124. The upper electrode 123 preferably comprises the upper and side walls of the process chamber 120. A plurality of protrusions 122 are provided on the edge or peripheral portion of the upper electrode 123 to increase the amount of the free electrons emitted from the edge or peripheral portion of the lower electrode 124 by increasing the surface area. Each protrusion 122 may be shaped as a circular cone, a three sided pyramid, a four sided pyramid, a five sided pyramid having one protruding point, a hemisphere, a polyhedron or any other desired shape which increases the electrode surface area. The apparatus according to the embodiment shown in FIG. 8 operates in the same manner as the apparatus of the first embodiment shown in FIG. 6.

In the embodiments referring to FIGS. 6 to 8, the protrusions 85, 102, 122 may be provided only on the peripheral portion of the upper electrode 84, 103, 123, or over the entire surface of the upper electrode. The plurality of protrusions 85, 102, 122 that are uniformly provided on the entire surface of the upper electrode 84, 103, 123, increase the amount of the free electrons emitted from the entire surface of the lower electrode 80, 104, 124, and thus increase the density of plasma and the etch rate.

In another embodiment of the present invention, the density of protrusions 85, 102, 122 may be varied across the upper electrode 84, 103, 123. For example, the density of protrusions may be higher in a first portion of the electrode than in a second portion. The protrusion density may be varied depending on the dimensions and layout of the process chamber to obtain an optimum plasma density and uniformity. Preferably, the density of protrusions decreases from the edge or peripheral portion of the upper electrode 84, 103, 123 to the center or inner portion, so that the protrusions 85, 102, 122 have a different radial density.

The protrusions 85, 102, 122 may alternatively be formed on the lower electrode 80, 104, 124 or on both the upper 84, 103, 123 and lower electrodes. Furthermore, the top and bottom electrodes may be reversed and the high frequency power source 90 may instead be electrically connected to the upper electrode. Alternatively, a first high frequency power source may be electrically connected to lower electrode and a second high frequency power source may be electrically connected to the upper electrode.

The preferred embodiments of the plasma processing apparatus were described as plasma dry etching apparatus. However, the plasma processing apparatus of the present invention may also be used for thin film deposition, for example by sputtering or chemical vapor deposition processes. In these embodiments, the electrode(s) containing protrusions are used to excite the precursor process gas into the plasma state to deposit a thin film in the chemical vapor deposition process or to excite a process gas into a plasma state to sputter off atoms from a target to form the thin film on the substrate in the sputtering process.

Increasing a portion of the surface area of the electrode provided inside the process chamber also increases the density uniformity of the plasma, which improves the etch uniformity of the etched layer or film or the deposition uniformity of the deposited layer or film. Also, increasing the entire surface area of the electrode provided inside the process chamber increases the overall density of plasma, which increases the etch and deposition rate.

Thus, an electrode and a plasma processing apparatus have been described according to the present invention. While the invention is susceptible to various modifications and alternative forms, specific embodiment have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

Description of the reference numerals of the drawings:
10, 70, 100, 120: process chamber
12, 72, 112, 130: gas supply line
14, 74, 110, 128: vacuum line
16, 76, 108, 127: valve
18, 78: vacuum pump
20, 50, 80, 104, 124: lower electrode
22, 82, 106, 126: wafer
24, 30, 40, 84, 103, 123: upper electrode
26, 87, 89: matching box
28, 88, 90: high frequency power source
32, 42, 52, 85, 102, 122: protrusion(s)
86: coil

What is claimed is:

1. An electrode for generating a plasma comprising a plurality of protrusions over an entire first side of the electrode, wherein the density of the protrusions at a first portion of the first side of the electrode is different from a density of the protrusions at a second portion of the first side of the electrode.

2. The electrode of claim 1, wherein the first portion of the first side of the electrode is a peripheral portion and the second portion of the first side of the electrode is an inner portion, and wherein the density of the protrusions is greater at the peripheral portion of the first side of the electrode than at the inner portion of the first side of the electrode.

3. An electrode for generating a plasma comprising a plurality of protrusions over a peripheral portion of the first side of the electrode and no protrusions over an inner portion of the first side of the electrode.

4. The electrode of claim 1, wherein the electrode comprises a wall of a plasma processing chamber.

5. The electrode of claim 1, wherein the electrode comprises a plate, a dome or a cylinder.

6. The electrode of claim 1, wherein the plurality of protrusions comprises a hemisphere, a polyhedron, a circular cone, a three sided pyramid, a four sided pyramid or a five sided pyramid.

7. A plasma processing apparatus, comprising:
a process chamber;
a first electrode in the process chamber;
a second electrode comprising a plurality of protrusions over an entire first side of the second electrode opposite to the first electrode, wherein a density of protrusions at the first portion of the first side of the second electrode is different from a density of protrusions at a second portion of the first side of the second electrode;
a gas supply line; and
a high frequency power source electrically connected to it least one of the first electrode and the second electrode.

8. The apparatus of claim 7, wherein the second electrode comprises a plurality of protrusions over an entire first side of the second electrode.

9. The apparatus of claim 8, wherein the density of protrusions at a first portion of the first side of the second electrode is different from a density of protrusions at a second portion of the first side of the second electrode.

10. The apparatus of claim 7, wherein the first portion of the first side of the second electrode is a peripheral portion and the second portion of the first side of the electrode is an inner portion, and
wherein the density of the protrusions is greater at the peripheral portion of the first side of the electrode than at the inner portion of the first side of the electrode.

11. A plasma processing apparatus comprising:
a process chamber;
a first electrode in the process chamber;
a second electrode comprising a plurality of protrusions over a peripheral portion of the first side of the second electrode and no protrusions over an inner portion of the first side of the second electrode
a gas supply line; and
a high frequency power source electrically connected to at least one of the first electrode and the second electrode.

12. The apparatus of claim 7, wherein the first electrode contains at least one protrusion.

13. The apparatus of claim 7, wherein the second electrode comprises a wall of the processing chamber.

14. The apparatus of claim 7, wherein the second electrode comprises a plate, a dome or a cylinder.

15. The apparatus of claim 7, wherein the protrusion comprises a hemisphere, a polyhedron, a circular cone, a three sided pyramid, a four sided pyramid or a five sided pyramid.

16. A plasma processing apparatus, comprising:
a process chamber;
a first electrode in the process chamber;
a second electrode comprising at least one protrusion opposite to the first electrode;

a gas supply line;

a first high frequency power source electrically connected to at least one of the first electrode and the second electrode;

a coil outside the process chamber; and a second high frequency power source electrically connected to the coil.

17. The apparatus of claim 7, wherein the apparatus is a plasma etching apparatus, a plasma enhanced chemical vapor deposition apparatus or a sputtering apparatus.

18. A method of processing a substrate, comprising:

placing a substrate over a lower electrode;

generating a plasma between the lower electrode and an upper electrode containing at least one protrusion;

contacting a surface of the substrate with positive ions generated in the plasma; and etching a portion of the substrate or depositing a film on the substrate.

* * * * *